United States Patent [19]

Lin

[11] Patent Number: 4,996,445

[45] Date of Patent: Feb. 26, 1991

[54] DISTURBANCE RESISTANT DATA STORAGE CIRCUIT

[75] Inventor: Stephen C. Y. Lin, Phoenix, Ariz.

[73] Assignee: Honeywell Inc., Minneapolis, Ind.

[21] Appl. No.: 379,395

[22] Filed: Jul. 13, 1989

[51] Int. Cl.[5] .................. G11C 11/00; H03K 3/29; H03K 19/20
[52] U.S. Cl. .................. 307/272.3; 307/289; 307/455; 307/467; 365/154
[58] Field of Search .................. 307/272.3, 289, 290, 307/455, 467; 365/154

[56] References Cited

U.S. PATENT DOCUMENTS 4,622,475  11/1986  Whiteley ................ 307/289

Primary Examiner—Stanley D. Miller
Assistant Examiner—Trong Phan
Attorney, Agent, or Firm—Gregory A. Bruns; William T. Udseth

[57] ABSTRACT

An improved disturbance resistant data storage circuit having a further transistor for each one of a pair of input transistors, the cross-coupled transistors, and the output transistors which are paired therewith.

11 Claims, 2 Drawing Sheets

DISTURBANCE RESISTANT DATA STORAGE CIRCUIT

BACKGROUND OF THE INVENTION

The present invention relates to circuits for storing representations of data and, more particularly, to such circuits used in monolithic integrated circuits which are subject to transient event disturbances.

There are many uses in digital systems for data storage circuits, i.e. data latches. Such latches are used frequently to store a signal value representing data received at a data input for a duration of time after an enabling signal of a particular logic value has also been received at an enable input. This arrangement is useful, for instance, in permitting subsequent portions of the digital system to operate on a fixed value signal at the output of the latch even though further changes are occurring at the latch data input.

Such data latches are commonly provided in monolithic integrated circuits, along with many further kinds of other circuitry, for purposes of improving performance, reducing size and reducing cost. Monolithic integrated circuit structural features arising in the implementation of such circuits have been shrinking rapidly in size in recent years. Along with this shrinkage, the electrical currents and electrical charges formed during the operation of the integrated circuits based on these features have also been diminishing in value. As a result, charges generated by certain charge generating disturbances, which in larger feature integrated circuits would not be a problem, become sufficiently large to cause difficulties in smaller feature integrated circuits.

In those voltage level state switching circuits, such as logic circuits or memory circuits including such data latch circuits, that are constructed using these smaller integrated circuit structures, such disturbance charges can be sufficient to cause switching from an existing logic state to another at points on the circuit where such charge is generated. The proper operation of the circuit could therefore be disturbed resulting in erroneous logic signals. Typically, such disturbances are local to the region near the disturbance and are temporary; thus, such a disturbance is often termed a "single event upset." Also, though the disturbances may be temporary, results of the disturbance may be stored and are subject to being propagated further in the system which may lead to longer term and more significant effects.

A common source of such charge generating disturbances is particle radiation. Such particles impinging on a monolithic integrated circuit chip will have "interactions" with the semiconductor material lattice structure and electrons along the paths thereof through the integrated circuit semiconductor material. This will result, for the short duration of these interactions, in raising the energy of the electrons involved in the conduction band and leaving corresponding holes in the valence band. Should such electron-hole pairs be generated sufficiently close to a semiconductor pn junction, the electrons and holes so situated are subject to being collected by the action of electric fields in the region resulting from the voltage applied to such junction and because of diffusions toward such junctions. The structure of transistor devices used in a monolithic integrated circuit, and the methods of operating such devices in the circuits using them generally, is such that only reverse-biased pn junctions need to be considered to understand the effects of a radiation particle impinging thereabout.

The electrons and corresponding holes will be separated by the electric fields near the reverse-biased junction with the electrons attracted to the positive voltage side of the junction and the holes being attracted, or repelled, into the portions of the semiconductor material on the other side of the junction. This separation of electrons and holes, in effect, provides a temporary current flow from the positive voltage side of the semiconductor pn junction to the opposite side of the structure, or, in effect, a radiation induced leakage current.

This current will be comprised of an immediate drift current component for electrons and holes which are immediately subject to such electric fields. A further component of this current will be provided by those electrons and holes which subsequently, by diffusion, move to be within the influence of such electric fields. Such current flows have the effect of discharging an n-type conductivity region if that region has been placed at a positive voltage with respect to a p-type conductivity region on the other side of the intervening junction so that this junction is reverse-biased. Such a discharge current reduces the positive voltage of the n-type region. Conversely, such currents tend to charge a p-type conductivity region, if that region has been placed at a negative voltage with respect to an n-type conductivity region on the other side of an intervening semiconductor pn junction to again reverse-bias that junction. Such a charging acts to reduce the negative voltage to thereby reduce the reverse-bias across the junction. Thus, in either situation, the charge generated by an impinging radiation particle would act in a manner to tend to reduce the magnitude of reverse-bias voltages provided across a reverse-biased semiconductor pn junction separating p-type conductivity and n-type conductivity regions suffering such an impingement.

One known data latch is the controlled latch circuit shown in FIG. 1. In that circuit, a pair of input npn bipolar transistors, 10 and 11, are provided with transistor 10 having its base connected to an input terminal, 12, and transistor 11 having its base connected to a further input terminal, 13. Input transistor 10 is paired with a further npn bipolar transistor, 14. Input transistor 11 is also paired with another npn bipolar transistor, 15. The collectors of transistors 10 and 14 are connected to one another and to a load resistor, 16. Similarly, the collectors of transistors 11 and 15 are connected together and to another load resistor, 17. The collectors of transistors 10 and 14 are also connected to the base of an output npn bipolar transistor, 18, for that pair, and again the collectors of transistors 11 and 15 are also connected to an output transistor, 19, for that pair. The other sides of load resistors 16 and 17, and the collectors of transistors 18 and 19, are connected to a terminal means, 20, adapted for connection to a source of relatively positive voltage.

Transistors 14 and 15 are cross-coupled transistors in that the collector of one is connected through an output transistor to the emitter of the other. Thus, the emitter of output transistor 18 is connected to the base of transistor 15, and the base of transistor 18 is connected to the collector transistor 14. Similarly, the emitter output transistor 19 is connected to the base of transistor 14, and the base of transistor 19 is connected to the collector of transistor 15.

Relatively positive voltage, applied to terminal 20, is taken with respect to a further terminal, 21, serving as the reference voltage or ground terminal and adapted for connection to a voltage supply also. A current sink arrangement is connected to terminal 21 formed by a further npn bipolar transistor, 22, and a resistor, 23, connected between the emitter of transistor 22 and terminal 21. The base of transistor 22 is adapted for connection to a reference voltage supplied to a further terminal, 24.

The emitters of the cross-coupled transistors 14 and 15 are also connected to this current sink means at the collector of transistor 22 through a further npn bipolar transistor, 25, having its base connected to a terminal, 27. The emitters of input transistors 10 and 11 are connected to this current sink at the collector of transistor 22 through a further npn bipolar transistor, 26. Supplying a signal to a terminal, 28, and so to the base of transistor 26 connected thereto, sufficient to switch it into "on" condition allows transistor 26 to pass the current drawn by the current sink means containing transistor 22 as supplied by input transistors 10 and 11. This arrangement allows signals at the bases of transistors 10 and 11 to set the logic states at the collectors thereof, and so at the outputs of the cross-coupled circuit involving transistors 14 and 15. Typically, the base of transistor 11 might be connected to a reference voltage and the base of transistor 10 may be connected to a source of logic signals which alternate between two voltage states on either side of the voltage value supplied to the based of transistor 11. Alternatively, complementary logic signals can be provided at the base of input transistors 10 and 11.

Similarly, the supplying of voltage to terminal 27, and so to the base of transistor 25 to switch it into the "on" condition, allows the voltage states established at the collectors of input transistors 10 and 11 to also be established and then maintained in the circuit involving cross-coupled transistors 14 and 15. These maintained states persist until subsequently altered by enablement of transistor 26 and input transistors 10 and 11. Thus, transistors 25 and 26 serve as latch circuit control transistors. The base of transistor 25 may typically be connected to a reference voltage applied to terminal 27 to which it is connected. The base of transistor 26 is shown connected to terminal 28 as a source of logic signals. The signal source for terminal 28 can operate between two voltage levels on either side of a reference voltage supplied to terminal 27. Transistor 26, in the "on" condition, allows establishment of selected voltage states at the collectors of input transistors 10 and 11 by the voltage states provided to the bases thereof, or alternatively by the voltage state and reference voltage applied to these inputs.

Output transistors 18 and 19 are provided to supply current in addition to what could be supplied through resistors 16 and 17, respectively, to operate the bases to which the emitters of these transistors are connected, and, in many instances, to provide the latch circuit outputs. In many situations, however, such additional current supply will not be needed and transistors 18 and 19 will be eliminated from the circuit. In such situation, the connections shown by the dashed lines in FIG. 1 will be provided instead. The resulting latch circuit outputs, 29 and 29', are shown for this latter situation.

As can be seen in FIG. 1, certainly for either transistors 14 or 15, there will always be one transistor in the "off" condition. In a situation where transistor 26 is in the "off" condition and transistor 25 in the "on" condition, the state of transistors 14 and 15 determine what information is being stored in the latch circuit. Thus, one of the transistors in the "on" condition and the other in the "off" condition defines one output logic state, and the opposite situation defines the other.

As indicated above, however, the transistor in the "off" condition, and having its collector-base junction reverse-biased, is subject in a radiation particle impingement situation to suddenly having that collector rapidly drop in voltage if radiation induced charge suddenly accumulates thereon. Such a sharp change in voltage, because of the cross-coupled feedback arrangement, will be propagated through to the base of the opposite transistor with a resulting risk of having the state of the latch circuit with these two cross-coupled transistors change from that logic state that had been present before the collector's sudden voltage drop to the opposite state. Thus, there is desired an improvement to the circuit of FIG. 1 to permit it to maintain logic states therein despite radiation particle impingement on reserve-biased junctions therein.

SUMMARY OF THE INVENTION

The present invention provides an improvement over the circuit described above in providing a further transistor for each one of the input transistors, the cross-coupled transistors, and the output transistors which is paired therewith, with each added transistor having its emitter connected to the emitter of its corresponding one of these transistors. Each transistor paired with an input transistor has its base connected to the base of that input transistor, and has its collector connected to the collector of the transistor paired with the corresponding cross-coupled transistor, these collectors together being connected to the base of the transistor paired with the corresponding output transistor and to a resistive means extending from the positive power supply. The base of each transistor paired with a cross-coupled transistor is connected to the emitter of the transistor paired with the opposite output transistor. The emitters of the input transistors and the transistors paired therewith are connected to a current sink through a control transistor, and the emitters of the transistors paired therewith are connected to that current sink through another control transistor. Further current sinks can be connected to the emitters of the output transistors and the transistors paired therewith.

DETAILED DESCRIPTION OF THE PREFERRED EMBODIMENTS

Figure 1:
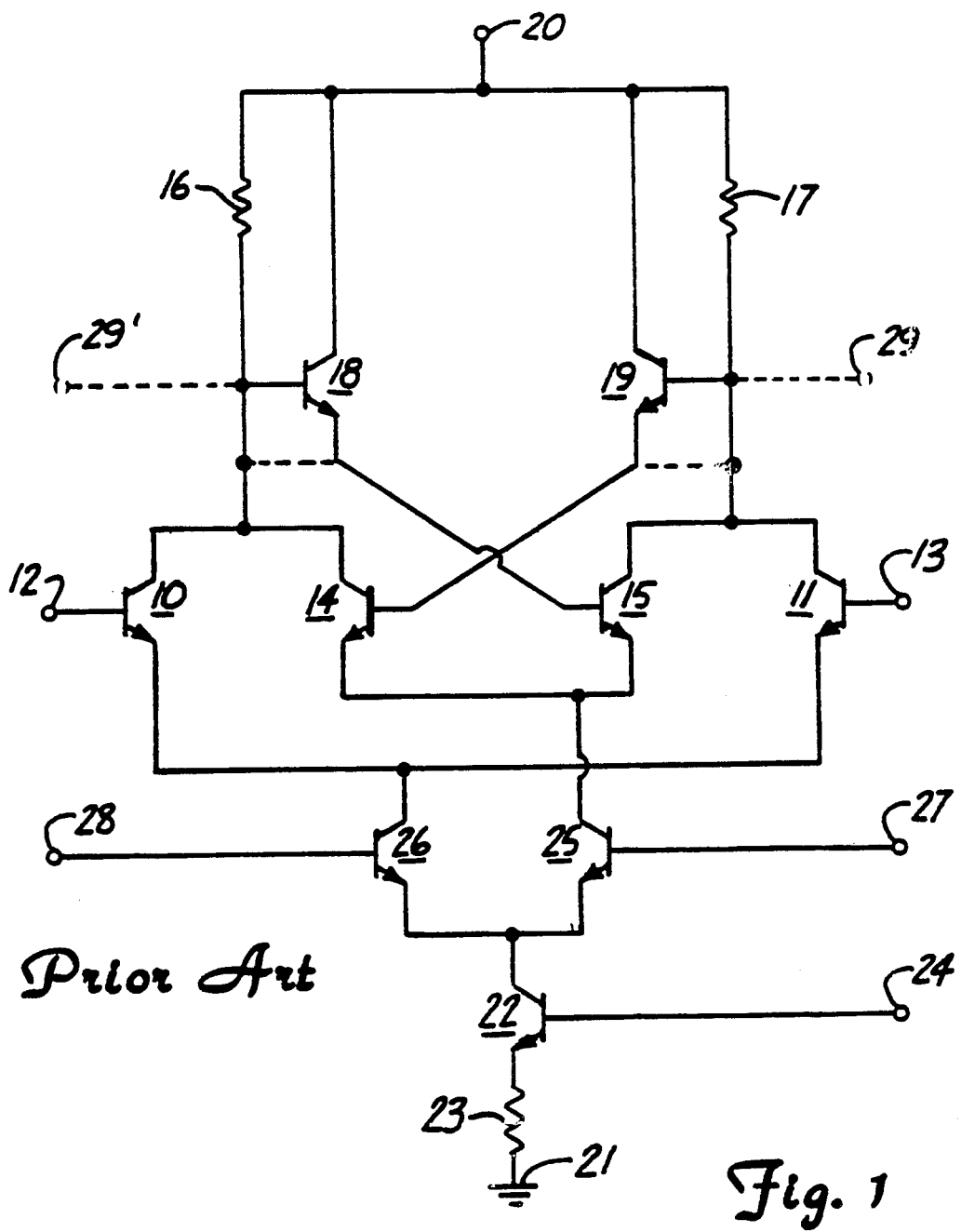
FIG. 1 shows a schematic diagram of a latch circuit in the prior art.
Figure 2:
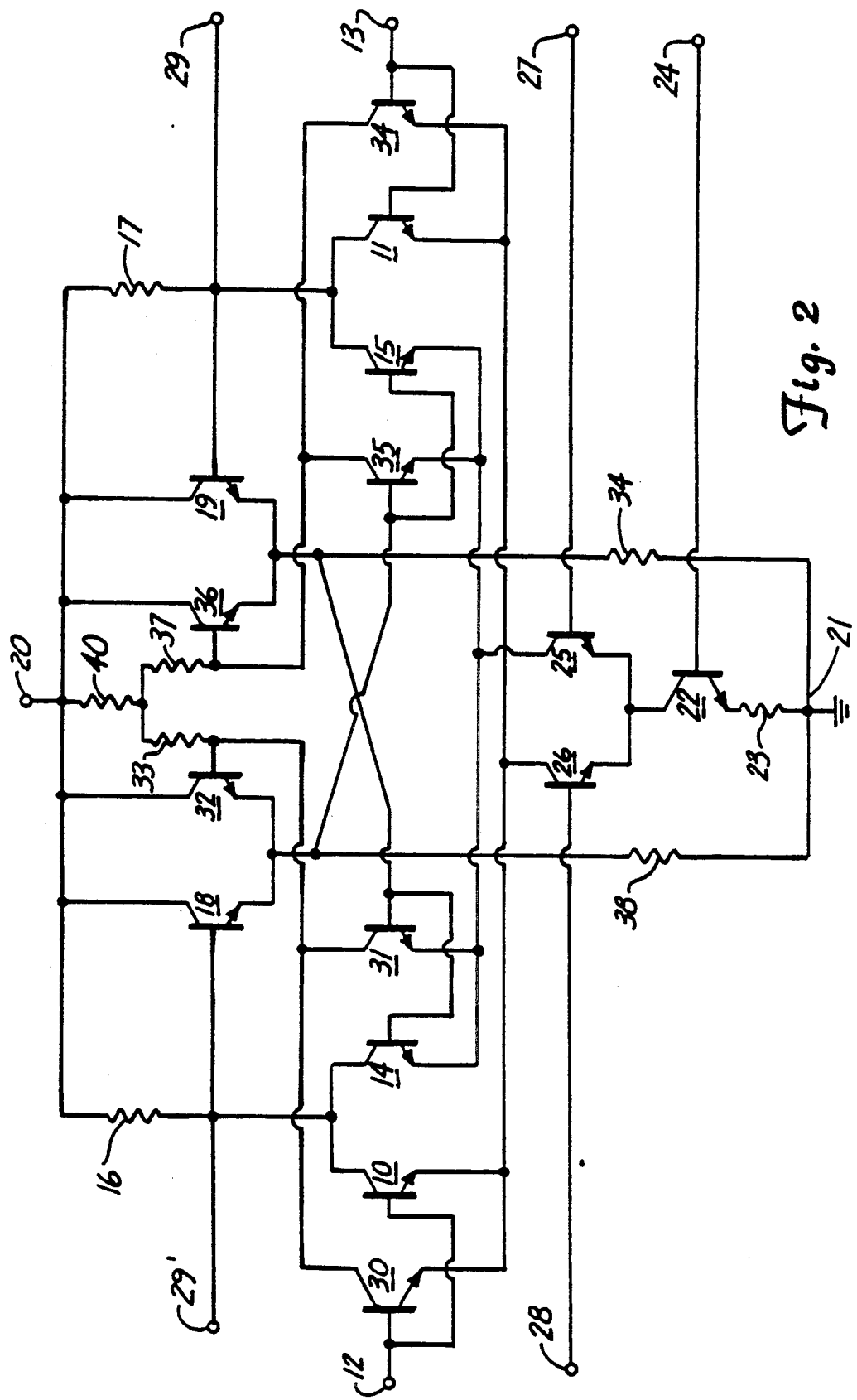
FIG. 2 shows a schematic diagram of an improvement over the circuit shown in FIG. 1 embodying the present invention.

FIG. 2 shows a schematic diagram of a latch circuit based on the latch circuit of FIG. 1, but with improvements therein which make the circuit more resistant to radiation particle impingement on reversed-biased collector-base junctions of bipolar transistors used therein. The circuit components in FIG. 2 which serve approximately the same function in that circuit as they did in FIG. 1 retaining the designation numerals they had in FIG. 1. Thus, the latch circuit signal inputs to receive data signals for storage purposes are again designated 12 and 13, and the signal inputs to receive control signals permitting or enabling latch circuit output logic state changes, or the maintaining of existing logic states, are again designated 27 and 28.

The terminal to receive a reference voltage for the current sink is again designated 24, and the transistor and resistor involved in the current sink are again designated 22 and 23. The input data signal receipt pair of bipolar transistors has its members again designated 10 and 14, and the complement input pair of transistors has its members again designated 11 and 15. The load resistors are again designated 16 and 17, and what being the output transistors in FIG. 1 are again designated 18 and 19 in FIG. 2. The outputs in the FIG. 2 latch circuit are shown taken at these load resistors even with the use of output resistors 18 and 19, and these outputs are again designated 29 and 29'.

Each of the bipolar transistors of FIG. 1 as appearing in FIG. 2 has another transistor paired therewith, the emitter of each being connected to the other. Thus, input data signal receipt and maintenance transistors 10 and 14 have a pair of supplementary input signal receipt npn bipolar transistors, 30 and 31, provided therewith such that the emitters of transistors 10 and 30 are connected together, and the emitters of transistors 14 and 31 are connected together. The base of transistor 30 is also connected to data latch input 12. The collectors of transistors 30 and 31 are connected together and to the base of a further output npn bipolar transistor, 32, paired with transistor 18, and to a resistor, 33. The bases of transistors 14 and 31 are connected together and to the emitter of output transistor 19.

In a similar manner, input data complement signal receipt and maintenance, or reference value receipt and maintenance, complement transistors 11 and 15 have a pair of supplementary complement npn bipolar transistors, 34 and 35, provided therewith. The emitters of transistors 11 and 34 are connected together, and the emitters of transistors 35 and 15 are connected together. The base of transistor 11 is also connected to data latch input 13. The collectors of transistors 34 and 35 are connected together and to the base of an added output transistor, 36, paired with transistor 19, and to a resistor, 37. The bases of transistors 15 and 35 are connected together and to the emitter of output transistor 18.

The emitters of the two paired output transistors 18 and 32 are connected together, and are connected through a resistor, 38, as a current sink to ground reference terminal 21. Similarly, the emitters of paired output transistors 19 and 36 are connected together, and through a further resistor, 34, as a current sink to ground reference terminal 21. Resistors 33 and 37 each have one end connected to one another and to a further resistor, 40 which in turn has its other end connected to positive supply voltage terminal 20. The collectors of transistors 32 and 36 are each also connected to positive supply terminal 20.

Assume that a reference voltage is applied to terminal 24 of about 1.4 volts, a reference supplied to terminal 27 of about 2.2 volts, a reference supplied to terminal 13 of about 3.0 volts, and a supply voltage supplied to terminal 20 of about 4.5 volts, all being typical operating voltages. If a high level logic state voltage is applied to inputs 12, such as about 3.2 volts, as a data input, and an enable signal in a high logic state of about 2.4 volts is applied to input 28, transistors 10 and 30, and transistor 26, will all be in the "on" condition. As a result, transistors 14 and 31, and transistors 15 and 35 will be in the "off" condition since transistor 25 will be in the "off" condition. This is because the voltage on terminal 28 will lead to a voltage at the junction of the emitters of transistors 25 and 26 that is sufficiently high so that no significant current will flow through the base of transistor 25.

A similar result occurs for transistors 11 and 34. The voltage applied to terminal 12 will be sufficiently great so that emitters of transistors 10 and 30 will be raised to a voltage leaving too little voltage between the base and emitters of transistors 11 and 34 for any significant base current to flow in those transistors. Hence, a significant current will be drawn through load resistor 16, and essentially no load current will be drawn through load resistor 17. Thus, a high logic state voltage level will occur at output terminal 29 of about 4.5 volts, and a low logic state voltage level of about 3.8 volts will occur at complementary output 29'.

Transistor 30 being in the "on" condition will lead to current flowing through resistors 40 and 33 so that the voltage at the base of transistor 32 will be approximately 3.9 volts. Hence, both transistors 18 and 32 will be in the "on" condition. Since transistors 34 and 35 are in the "off" condition, the base of transistor 36 will be at approximately 4.3 volts. Hence, transistor 19 will be in the "on" condition, and transistor 36 will be in the "off" condition. A data signal presenting a low logic state voltage value at terminal 12 will lead to approximately an interchange between the voltage values on the nodes that mirror one another on either side of the center line passing through terminal 20.

Assume that a high logic state voltage value is provided to terminal 12 so that the nodes of the circuit and the voltages thereon are as described above. A desire to latch the logic states appearing on terminals 29 and 29' in this situation to keep them the same despite alternative logic states occurring at input terminal 12 requires a change from a high logic state voltage level on terminal 28 to a low voltage state logic level. This will lead to switching transistor 26 into the "off" condition with the result that transistor 25 will be switched to the "on" condition. The voltage that is described at the other nodes of the circuit will remain approximately as they were except for changes at input 12. An exception will be that the voltage at the collector of transistor 25 will become what had been the voltage on the collector of transistor 26 when it was in the "on" condition, and vice versa.

Transistors 14 and 31 will therefore be in the "on" condition substituting for transistors 10 and 30. Transistor 14 will draw current through load resistor 16 in place of transistor 10. Transistor 31 draws current through resistors 33 and 40 in place of transistor 30. Thus, the current drawn by transistor 31 continues to keep the base of transistor 32 at a voltage lower than that on the base of transistor 36 since transistor 35 continues in the "off" condition. As a result, transistor 36 remains in the "off" condition. The voltage at the emitters of transistors 36 and 19 set by the voltage at output 29 is applied to the bases of transistors 14 and 31 keeping them in the "on" condition. The resulting voltage at the emitters of transistors 14 and 31 will be sufficiently high, given the voltage occurring at the bases of transistors 15 and 35 supplied from the emitters of transistors 18 and 32 being lower than that at the bases of transistors 14 and 31, to leave too small a voltage to forward bias transistors 15 and 35 into the "on" condition. Hence, the logic states which were set at latch circuit output terminals 29 and 29' by the logic state at terminal 12 before the logic state change at terminal 28 commanding the storage of these states will continue at these outputs. Since transistor 26 is in the "off" condition, signal changes at input 12 will have no affect on that state because no current can flow through transistors 10 and 30 in response to such changes.

Consider now a radiation particle impact which leads to output terminal 29 being driven sharply lower in voltage. This can occur because of the radiation particle impact impinging on the collector-base junction of either of transistors 15 or 35 which have both been in the "off" condition requiring a reverse biased collector-base junction. Such a sharp reduction in voltage could lead to transistors 14 and 31 being switched to the "off" condition as will occur for transistor 19 with the sharp voltage drop on its base.

However, the addition of transistor 36 assures that even though transistor 19 is switched to the "off" condition by such a sharp voltage drop single upset event on output terminal 29, the voltage will be maintained on the bases of transistors 14 and 31 by transistor 36 switching into the "on" condition as transistor 19 goes off. A similar situation occurs at output 29' in the event of a radiation particle impact involving the collector-based junctions of transistors 14 and 31 should output terminal 29' alternatively be in a high logic state. Since such radiation particle impact transient events are very short in time, the ability of the circuit to maintain the logic state therein during such an impact means that the circuit node at the collector of transistor 15 will recover its former high logic state voltage value before another such impact can occur, this recovery happening through that node being charged through load resistor 17. Thus, the latch circuit of FIG. 2 has a much improved capability to operate without error while withstanding a radiation particle impact environment than does the latch circuit of FIG. 1.

Although the present invention has been described with reference to preferred embodiments, workers skilled in the art will recognize that changes may be made in form and detail without departing from the spirit and scope of the invention.

What is claimed is:

1. An improvement for a data storage circuit having first and second inputs, and first and second outputs, said data storage circuit also having first and second initial receipt control bipolar transistors, first and second initial complement control bipolar transistors, a receipt load means and a complement load means, said first initial receipt control bipolar transistor base being electrically coupled to said first input, said first and second initial receipt control bipolar transistors each having an emitter thereof electrically coupled to a first current determination means, said receipt load means electrically connected between a first terminal means suited for electrical coupling to a first source of voltage and both collectors of said first and second initial receipt control bipolar transistors which together are electrically coupled to said second initial complement control bipolar transistor at its base, said first initial complement control bipolar transistor base being electrically coupled to said second input, said first and second initial complement control bipolar transistors each having an emitter thereof electrically coupled to said first current determination means, said complement load means electrically connected between said first terminal means and both collectors of said first and second initial complement control bipolar transistors which together are electrically coupled with said second initial receipt control bipolar transistor at its base, said improvement comprising:

a first receipt drive bipolar transistor having both its collector and its base electrically coupled to said first terminal means;

a first complement drive bipolar transistor having both its collector and its base electrically coupled to said first terminal means;

first and second supplementary receipt control bipolar transistors with said first supplementary receipt control bipolar transistor having its base electrically coupled to said first input and said second supplementary receipt control bipolar transistor having its base electrically coupled to said first complement drive transistor at its emitter, said first and second supplementary receipt control bipolar transistors each having a collector thereof electrically coupled to said first receipt drive bipolar transistor at its base, and said first and second supplementary receipt control bipolar transistors each having an emitter thereof electrically coupled to said first current determination means; and first and second supplementary complement control bipolar transistors with said first supplementary complement control bipolar transistor having its base electrically coupled to said second input and said second supplementary complement control bipolar transistor having its base electrically coupled to said first complement drive transistor at its emitter, said first and second supplementary complement control bipolar transistors each having a collector thereof electrically coupled to said first complement drive bipolar transistor at its base, and said first and second supplementary complement control bipolar transistors each having an emitter thereof electrically coupled to said first current determination means.

2. The apparatus of claim 1 wherein said receipt load means comprises a second receipt drive bipolar transistor and a receipt load device electrically connected between said first terminal means and both collectors of said first and second initial receipt control bipolar transistors, and said complement load means comprises a second complement drive bipolar transistor and a complement load device electrically connected between said first terminal means and both collectors of said first and second initial complement control bipolar transistors, said second receipt drive transistor having its collector electrically coupled to said first terminal means, its base electrically coupled to both collectors of said first and second initial receipt control bipolar transistors, and its emitter electrically coupled to said second initial complement control bipolar transistor base, said second complement drive transistor having its collector electrically coupled to said first terminal means, its base electrically coupled to both collectors of said first and second initial complement control bipolar transistors, and its emitter electrically coupled to said second initial receipt control bipolar transistor base.

3. The apparatus of claim 1 wherein a second current determination means is electrically connected between a second terminal means suited for electrical coupling to a second source of voltage and an emitter of said first receipt drive bipolar transistor, and a third current determination means is electrically connected between said second terminal means and an emitter of said first complement drive bipolar transistor.

4. The apparatus of claim 1 wherein said first receipt drive bipolar transistor has its base electrically coupled to said first terminal means through a first resistive means, and wherein said first complement drive bipolar transistor has its base electrically coupled to said first terminal means through a second resistive means.

5. The apparatus of claim 1 wherein said first initial receipt control bipolar transistor emitter, said first supplementary receipt control bipolar transistor emitter, said first initial complement control bipolar transistor emitter, and said first supplementary complement control bipolar transistor emitter are electrically coupled to said first current determination means, as aforesaid, through a first enablement bipolar transistor by being electrically coupled to a collector thereof, said first enablement bipolar transistor having its emitter electrically coupled to said first current determination means, and wherein said second initial receipt control bipolar transistor emitter, said second supplementary receipt control bipolar transistor emitter, said second initial complement control bipolar transistor emitter, and said second supplementary complement control bipolar transistor emitter are electrically coupled to said first current determination means, as aforesaid, through a second enablement transistor by being electrically coupled to said collector thereof, said second enablement transistor having its emitter electrically coupled to said first current determination means.

6. The apparatus of claim 2 wherein said first initial receipt control bipolar transistor emitter, said first supplementary receipt control bipolar transistor emitter, said first initial complement control bipolar transistor emitter, and said first supplementary complement control bipolar transistor emitter are electrically coupled to said first current determination means, as aforesaid, through a first enablement bipolar transistor by being electrically coupled to a collector thereof, said first enablement bipolar transistor having its emitter electrically coupled to said first current determination means, and wherein said second initial receipt control bipolar transistor emitter, said second supplementary receipt control bipolar transistor emitter, said second initial complement control bipolar transistor emitter, and said second supplementary complement control bipolar transistor emitter are electrically coupled to said first current determination means, as aforesaid, through a second enablement transistor by being electrically coupled to said collector thereof, said second enablement transistor having its emitter electrically coupled to said first current determination means.

7. The apparatus of claim 3 wherein said second and third current determination means are each of resistive means.

8. The apparatus of claim 4 wherein a second current determination means is electrically connected between a second terminal means suited for electrical coupling to a second source of voltage and an emitter of said first receipt drive bipolar transistor, and a third current determination means is electrically connected between said second terminal means and an emitter of said first complement drive bipolar transistor.

9. The apparatus of claim 5 wherein said first current determination means comprises a first current determination transistor having, between its emitter and a second terminal means suited for electrical coupling to a second source of voltage, a current determination resistive means electrically connected in series.

10. The apparatus of claim 6 wherein a second current determination means is electrically connected between a second terminal means suited for electrical coupling to a second source of voltage and both of said emitters of said first and second receipt drive bipolar transistors, and a third current determination means is electrically connected between said second terminal means and both of said emitters of said first and second complement drive bipolar transistors.

11. The apparatus of claim 6 wherein said first receipt drive bipolar transistor has its base electrically coupled to said first terminal means through a first resistive means, and wherein said first complement drive bipolar transistor has its base electrically coupled to said first terminal means through a second resistive means.

* * * * *